United States Patent [19]
Hirota

[11] Patent Number: 4,950,843
[45] Date of Patent: Aug. 21, 1990

[54] MOUNTING STRUCTURE FOR SEMICONDUCTOR DEVICE

[75] Inventor: Yukitsugu Hirota, Kamakura, Japan

[73] Assignee: Nissan Motor Co., Ltd., Yokohama, Japan

[21] Appl. No.: 275,836

[22] Filed: Nov. 25, 1988

[30] Foreign Application Priority Data

Nov. 25, 1987 [JP] Japan .......................... 62-178307[U]

[51] Int. Cl.⁵ .............................................. H05K 1/00
[52] U.S. Cl. .................................... 174/260; 174/259
[58] Field of Search ................ 174/685, 250, 260, 259

[56] References Cited
U.S. PATENT DOCUMENTS 3,745,227  7/1973  Chernick et al. .................. 174/68.5
3,851,223 11/1974  Yonezuka et al. ............. 174/68.5 X
3,972,062  7/1976  Hopp ................................ 357/81 X
3,984,166 10/1976  Hutchison ....................... 439/109 X
4,480,288 10/1984  Gazdik et al. ................. 174/68.5 X
4,654,248  3/1987  Mohammed .................... 174/68.5 X Primary Examiner—Morris H. Nimmo
Attorney, Agent, or Firm—Foley & Lardner, Schwartz, Jeffery, Schwaab, Mack, Blumenthal & Evans

[57] ABSTRACT

A mounting structure for a semiconductor device which is mounted onto a metallic wiring layer formed on a surface portion of a metal printed circuit board, in which bonding portions defined by substantially square etched holes are formed in a portion of the metallic wiring layer contacting a bonding material interposed between the metallic wiring layer and the body of the semiconductor device.

7 Claims, 2 Drawing Sheets

MOUNTING STRUCTURE FOR SEMICONDUCTOR DEVICE

BACKGROUND OF THE INVENTION

1. Field of the Invention

The present invention relates to a mounting structure for a semiconductor device and, in particular, to a chip-on-board mounting structure for a semiconductor device attached to a metallic wiring layer of a metal printed circuit board.

2. Description of the Background Art

In FIG. 1, there is shown a conventional mounting structure for a semiconductor device. A semiconductor device 1 such as a power transistor or the like is mounted to a surface of a metal printed circuit board 2 through solder 6, and the metal printed circuit board 2 includes a metallic substrate 3, an insulating layer 4 which is made of an insulating material such as an epoxy resin, a silicone resin or the like and is formed on the metallic substrate 3, and a metallic wiring layer 5, which is made of a copper foil or the like in a predetermined pattern form and is formed on the insulating layer 4. In this structure, the heat generated by the semiconductor device 1 is transmitted and released to the metallic substrate 3 via the metallic wiring layer 5 and the insulating layer 4.

In this embodiment, the semiconductor device 1 and the metallic wiring layer 5 having respectively different thermal expansion coefficients are tightly connected to each other through the solder 6, and thus a large shearing stress or strain is caused in the solder 6 when the semiconductor 1 generates heat during the operation. As a result, fatigue and failure are caused in the solder 6, and an insufficient contact between the semiconductor 1 and the metallic wiring film 5 occurs.

SUMMARY OF THE INVENTION

Accordingly, it is an object of the present invention to provide a mounting structure for a semiconductor device, free from the aforementioned defects and drawbacks of the prior art, which is capable of reducing shearing stress and strain caused in solder coupling the semiconductor device and a metal printed circuit board, preventing a destruction of a junction portion therebetween, and preventing an insufficient contact and a breakdown of the semiconductor device.

In accordance with one aspect of the invention, there is provided a mounting structure for a semiconductor device, comprising a metal printed circuit board having a surface portion comprising a metallic wiring layer, and a body of a semiconductor device mounted onto the metallic wiring layer the metallic wiring layer including a plurality of substantially square etched bonding portions contacting a bonding material interposed between the body and the bonding portions.

DESCRIPTION OF THE PREFERRED EMBODIMENTS

Figure 1:
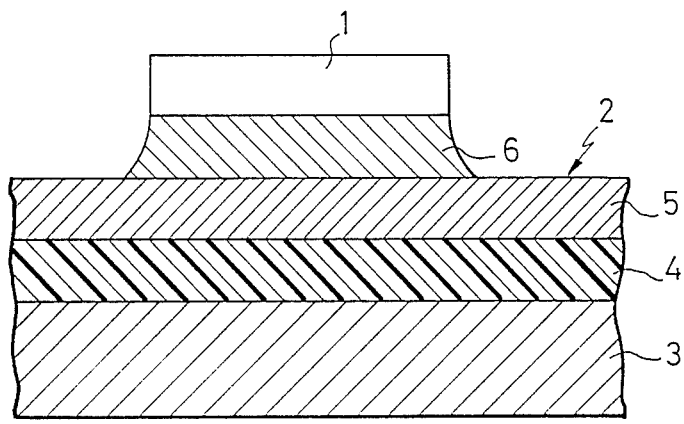
FIG. 1 is a cross sectional view of a conventional mounting structure for a semiconductor device.
Figure 2:
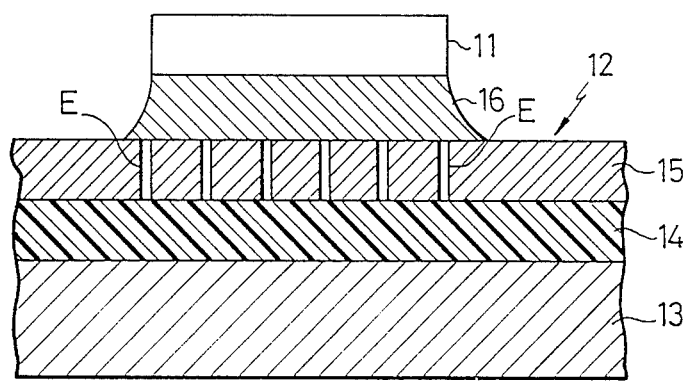
FIG. 2 is a cross sectional view of a first embodiment of a mounting structure for a semiconductor device according to the present invention.
Figure 3:
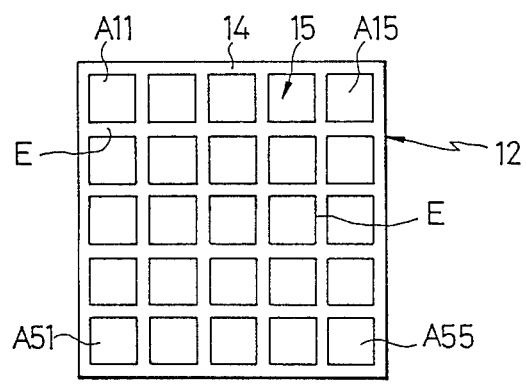
FIG. 3 is a top plan view of an etched surface pattern of a metallic wiring layer shown in FIG. 2.

Referring now to the drawings, wherein like reference characters designate like or corresponding parts throughout the several views, there is shown in FIGS. 2 and 3, the first embodiment of a chip-on-board mounting structure for a semiconductor device according to the present invention.

In the drawings, a body of a semiconductor device 11 such as a power transistor or the like is secured to a portion of surface of a metal printed circuit board 12 through a bonding material 16 such as solder or the like. The metal printed circuit board 12 includes an insulating film or layer 14 made of an insulating material such as an epoxy resin, a silicone resin or the like formed on a metallic substrate 13, and a metallic wiring film or layer 15 made of a metallic foil of copper or the like in a predetermined pattern formed on the insulating layer 14. In a portion contacting the bonding material 16, the metallic wiring layer 15 is divided into a plurality of bonding portions, for instance, $5 \times 5 = 25$ square portions $A_{11}$ to $A_{55}$ having an equal area, by forming checkered grooves or holes E through the wiring layer 15 using an etching process, in which the checkered holes E reach the insulating layer 14, as shown in FIG. 3. Now, assuming that the etching area of the metallic wiring layer 15 is a square area having one side of L mm, each square portion having one side of approximately L/5 mm can be obtained.

As is well known, when two members having different thermal expansion coefficients are connected to each other by soldering or welding, a shearing strain caused in solder due to heat increases in proportion to approximately a square of a length of a connection portion between the two members, as disclosed in Mitsubishi Electric Technical Report, Vol. 53, No. 3, pp231. Hence, when the bonding area of the wiring layer 15 is divided into 25 equally checkered square bonding portions $A_{11}$ to $A_{55}$, as described above with reference to FIG. 3, the shearing strain caused in the solder 16 can be largely reduced to approximately $(1/5)^2$, i.e., 1/25 that of the conventional mounting structure. Further, the yield stress of the solder 16 varies depending on the thickness of the applied solder 16 when the solder 16 is broken. Therefore, when the dividing conditions of the bonding area of the metallic wiring layer 15 is properly determined by experimentation, the destruction of the solder 16 due to the fatigue or failure can be exactly prevented, and the insufficient contact and the breakdown of the semiconductor device due to the shearing strain of the solder 16 can be also effectively prevented.

Figure 4:
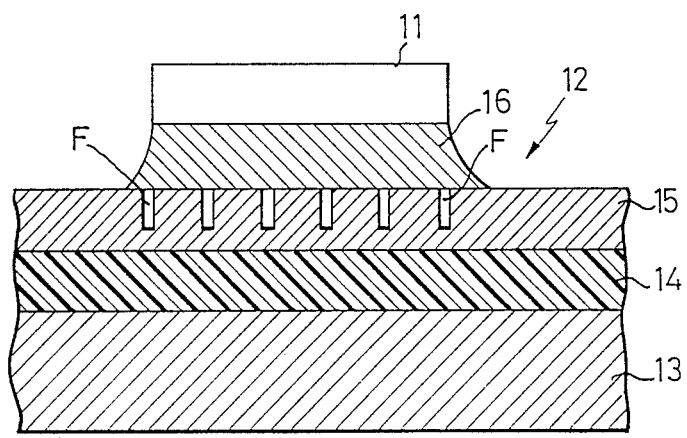
FIG. 4 is a cross sectional view of a second embodiment of a mounting structure for a semiconductor device according to the present invention.

In FIG. 4, there is shown the second embodiment of a mounting structure for a semiconductor device according to the present invention, having the same construction as that of the first embodiment shown in FIG. 2, except that checkered holes F are etched into an intermediate depth of the metallic wiring layer 15 so as not to reach the insulating layer 14. In this embodiment, the same effects and advantages as those of the first embodiment of the present invention can be obtained.

Figure 5:
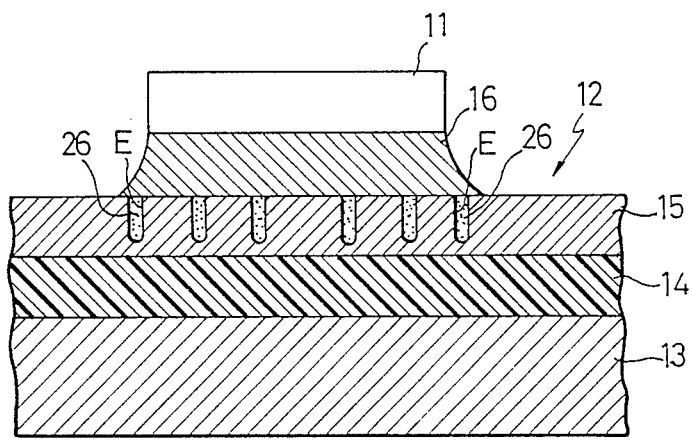
FIG. 5 is a cross sectional view of a third embodiment of a mounting structure for a semiconductor device according to the present invention.

In FIG. 5, there is shown the third embodiment of a mounting structure for a semiconductor device according to the present invention, having the same construction as that of the first embodiment shown in FIG. 2, except that the etched holes E are filled with solder 26. In this embodiment, since the divided square portions $A_{11}$ to $A_{55}$ are mechanically connected by the solder 26, the effect for moderating or reducing the stress caused in the solder 16 due to the heat is somewhat lowered, but, since the Young's modulus of the solder is approximately one figure smaller than that of the metallic wiring layer 15 such as the copper foil, the stress given to the semiconductor device 11, the wiring layer 15 and the solder 16 can be extremely reduced. Further, the divided square portions $A_{11}$ to $A_{55}$ are thermally linked, and thus the temperature uniformity in the square portions $A_{11}$ to $A_{55}$ is largely improved. As a result, the breakdown of the semiconductor device due to a partial temperature increase can be effectively prevented, thereby further improving the reliability and the life of the semiconductor device according to the present invention. In this embodiment, when the width of the etched holes E is narrow, it can be widened by a taper etching process or the like to improve the filling rate of the solder 26.

What is claimed is:

1. A mounting structure for a semiconductor device, comprising:

a metal printed circuit board having a surface portion comprising a metallic wiring layer, the metallic wiring layer including a plurality of bonding portions defined by holes etched in the metallic wiring layer; and a semiconductor device having a body connected to the bonding portions of the metallic wiring layer by means of a bonding material interposed therebetween;

wherein the metallic wiring layer is divided into the plurality of bonding portions such that a shearing strain caused in the bonding material due to heating of the semiconductor device and the metallic wiring layer is reduced.

2. The structure of claim 1, wherein the holes are filled by solder.

3. The structure of claim 1, wherein the metal printed circuit board comprises includes a metallic substrate, an insulating layer formed thereon, and the metallic wiring layer formed on the insulating layer.

4. The structure of claim 3, wherein the insulating layer comprises an epoxy resin.

5. The structure of claim 3, wherein the metallic wiring layer comprises copper.

6. The structure of claim 1, wherein each bonding portion is substantially square.

7. The structure of claim 6, wherein the plurality of substantially square bonding portions form a substantially square geometric pattern in the metallic wiring layer.

* * * * *